(12) United States Patent
Brezza et al.

(10) Patent No.: US 11,798,937 B2
(45) Date of Patent: Oct. 24, 2023

(54) BIPOLAR TRANSISTOR AND MANUFACTURING METHOD

(71) Applicant: STMicroelectronics (Crolles 2) SAS, Crolles (FR)

(72) Inventors: Edoardo Brezza, Grenoble (FR); Alexis Gauthier, Meylan (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 9 days.

(21) Appl. No.: 17/503,621

(22) Filed: Oct. 18, 2021

(65) Prior Publication Data

US 2022/0122969 A1 Apr. 21, 2022

(30) Foreign Application Priority Data

Oct. 19, 2020 (FR) ...................................... 2010686

(51) Int. Cl.
| | |
|---|---|
| *H01L 29/66* | (2006.01) |
| *H01L 21/22* | (2006.01) |
| *H01L 27/082* | (2006.01) |
| *H01L 21/225* | (2006.01) |
| *H01L 21/265* | (2006.01) |
| *H01L 21/8222* | (2006.01) |
| *H01L 29/737* | (2006.01) |
| *H01L 29/732* | (2006.01) |
| *H01L 29/08* | (2006.01) |

(52) U.S. Cl.
CPC ...... *H01L 27/0825* (2013.01); *H01L 21/2205* (2013.01); *H01L 21/2253* (2013.01); *H01L 21/26513* (2013.01); *H01L 21/8222* (2013.01); *H01L 29/0821* (2013.01); *H01L 29/66242* (2013.01); *H01L 29/732* (2013.01); *H01L 29/737* (2013.01); *H01L 29/7371* (2013.01)

(58) Field of Classification Search
CPC ............. H01L 27/0825; H01L 21/2253; H01L 21/26513; H01L 21/8222; H01L 29/66242; H01L 29/7371; H01L 21/2205; H01L 29/0821; H01L 29/732; H01L 29/737

See application file for complete search history.

(56) References Cited

U.S. PATENT DOCUMENTS

| | | |
|---|---|---|
| 10,224,423 B1 | 3/2019 | Gauthier et al. |
| 2002/0100917 A1 | 8/2002 | Chu et al. |
| 2005/0250289 A1* | 11/2005 | Babcock ............. H01L 29/7378 257/E21.612 |

(Continued)

FOREIGN PATENT DOCUMENTS

FR 3087047 A1 4/2020

OTHER PUBLICATIONS

INPI Search Report and Written Opinion for FR Appl. No. 2010686 dated Jul. 1, 2021 (10 pages).

(Continued)

*Primary Examiner* — David Vu
*Assistant Examiner* — Brandon C Fox
(74) *Attorney, Agent, or Firm* — CROWE & DUNLEVY

(57) ABSTRACT

A bipolar transistor includes a collector region having a first doped portion located in a substrate and a second doped portion covering and in contact with an area of the first doped portion. The collector region has a doping profile having a peak in the first portion and a decrease from this peak up to in the second portion.

40 Claims, 9 Drawing Sheets

(56) References Cited

U.S. PATENT DOCUMENTS

| | | | |
|---|---|---|---|
| 2006/0040453 A1 | 2/2006 | Bock et al. | |
| 2009/0108300 A1* | 4/2009 | Gluschenkov | H01L 29/7371 257/E29.188 |
| 2013/0092939 A1 | 4/2013 | Kim | |
| 2015/0318384 A1* | 11/2015 | Boeck | H01L 29/1004 257/586 |
| 2018/0286968 A1* | 10/2018 | Jain | H01L 29/66242 |
| 2020/0203333 A1* | 6/2020 | Chen | H01L 29/732 |
| 2021/0202717 A1* | 7/2021 | Jain | H01L 29/66318 |

OTHER PUBLICATIONS

B.Heineman "SiGe HBT With FR/FMAX of 505 GHz/720 GHz" IHP Frankfurt (Germany) IEDM 16-51 2016 IEEE.

Holger Rucker an Bernd Heinemann "High-Performance Sige HTBs for Next <Generation Bicmos Technology" Semiconductor Science and Technology 2018 (114003).

* cited by examiner

BIPOLAR TRANSISTOR AND MANUFACTURING METHOD

PRIORITY CLAIM

This application claims the priority benefit of French Application for Patent No. 2010686, filed on Oct. 19, 2020, the content of which is hereby incorporated by reference in its entirety to the maximum extent allowable by law.

TECHNICAL FIELD

Implementations and embodiments of the invention relate to electronic components, in particular bipolar transistors and the manufacturing methods thereof, for example heterojunction bipolar transistors (HBT transistors) having a base containing silicon and germanium, and more particularly the doping of the collectors of these bipolar transistors.

BACKGROUND

A bipolar transistor is a semiconductor-based electronic device whereof the operating principle is based on two PN junctions, one forward and the other reverse.

The doping of the collector in a bipolar transistor, particularly a heterojunction bipolar transistor, is important because it affects the values that define the performances of the transistor, particularly the operating frequency thereof, the maximum oscillation frequency thereof and the main capacities thereof.

Bipolar transistors have been the subject of many publications, in particular: United States Patent Application Publication No. 2020/0111890 (French Application for Patent No. 3087047); U.S. Pat. No. 10,224,423; Heinemann, et al., "SiGe HBT with fx/fmax of 505 GHz/720 GHz", 2016 IEEE International Electron Devices Meeting (IEDM). IEEE, 2016; and Rúcker, et al., "High-performance SiGe HBTs for next generation BiCMOS technology", Semiconductor Science and Technology 33.11 (2018): 114003 (all incorporated herein by reference).

In these publications, the doping of the collector region of the bipolar transistor is carried out, for example, by an in situ doping during the epitaxy of the collector or also by implantation of dopants after epitaxy of the collector.

The method constraints such as, for example, the duration, cost, type of dopant, selectivity are difficult to satisfy for in situ doping during epitaxy.

Furthermore, it is complicated to co-integrate in the same integrated circuit high-speed bipolar transistors and bipolar transistors with high collector-emitter breakdown voltage that require different doping of the respective collectors thereof because an in situ doping then involves performing different epitaxies.

Moreover, an implantation of the collector after epitaxy requires the use of mask(s).

Accordingly, there is a need for a collector doping technique having an industrially acceptable cost and complexity and that also optionally makes possible easy co-integration of high-speed transistors and high breakdown voltage transistors within the same integrated circuit.

SUMMARY

According to one implementation and embodiment, it is proposed to use a diffusion of dopants, during the epitaxy, and activated by the epitaxy, from a dopant reservoir underlying the epitaxiated portion.

According to one aspect, it is thus proposed a method for manufacturing at least one bipolar transistor, for example a heterojunction bipolar transistor, within an integrated circuit.

This method comprises producing a collector region including an implantation of dopants within a semiconductor substrate so as to form a first doped portion of the collector region and a formation of a second doped portion of the collector region covering and in contact with an area of the first doped portion.

The formation of the second doped portion includes an epitaxy of a non-doped semiconductor material, for example non-doped single-crystal silicon, from said area and a diffusion of dopants in the epitaxiated material, from the first doped portion, said diffusion being activated at least by said epitaxy.

A non-doped semiconductor material, for example silicon, is in general, for example, a material having a concentration of dopants less than $10^{15}$ atoms per $cm^3$.

Moreover, an epitaxy of semiconductor material, for example an epitaxy of single-crystal silicon, is generally carried out at a given temperature for a certain time. Therefore, this temperature makes it possible to activate the diffusion of dopants in the epitaxiated material from the underlying reservoir, that is to say from the first doped portion.

However, the diffusion may also continue during subsequent conventional steps of manufacturing of the bipolar transistor depending on the thermal budgets used.

Such a solution is therefore simple to implement at an industrially acceptable cost.

Moreover, as will be seen in more detail hereafter, it easily makes possible the co-integration of transistors of different types (high-speed transistor or high breakdown voltage transistor) because one and the same epitaxy is used.

The diffusion of dopants is advantageously controlled, and the method accordingly comprises preferably a control of this diffusion.

Several solutions are possible to carry out this control.

According to one implementation, the control may comprise an adjustment of the dose of dopants, for example of the phosphorus dose and/or of the depth of the quantity peak of dopants implanted in said area.

According to one implementation, the control may further include a carbon ion implantation in the substrates so as to include carbon in said first doped portion.

Indeed, carbon will make it possible to limit the diffusion of dopants.

According to one implementation, the control may comprise an adjustment of the carbon dose and/or of the depth of the quantity peak of carbon implanted in said area, relative to the adjustment of the dose of dopants and/or of the depth of the quantity peak of dopants, for example phosphorus, implanted in said area.

Of course, these various implementations making possible a control of the diffusion of dopants may be used alone or in combination, one with at least another.

The second collector portion comes into contact with a base region of the transistor.

In addition, according to one variant, the epitaxy of non-doped material (single-crystal silicon for example) is continued up to said base region.

However, it is also possible, according to another variant, that the epitaxy of the non-doped material (the single-crystal silicon, for example) stops at a distance from the base region and said control then comprises a continuation of the epitaxy with an in situ doping of carbon in the non-doped material so as to form in said second portion an upper layer of the semiconductor material containing carbon coming into contact with the base region.

The person skilled in the art will know how to choose the various possibilities for carrying out the control of the diffusion of dopants and the various quantities of dopants and/or of carbon and the relative positions of the peaks of dopants (phosphorus, for example, and of carbon) implanted depending on the final doping profile of the collector desired for the transistor given the thermal budgets implemented in the manufacture of the transistor.

According to one implementation, the method comprises a formation of a stack of layers covering said first doped portion, a formation of a cavity in said stack until uncovering the surface of an area Z of the first doped portion and the formation of said second doped portion in said cavity.

It is possible in some cases, that the formation of the stack, has due to the thermal budgets implemented up to then, affected the initial concentration of dopants implanted in the substrate and being used as a reservoir for the diffusion of the second portion of collector region.

Thus, it may be preferable, in some cases, that prior to the formation of said second portion, an additional, for example surface, implantation of said dopants be carried out in the first doped portion through said cavity.

It is also possible to provide an additional carbon ion implantation, for example a surface implantation, in the first doped portion through said cavity.

According to another aspect, it is proposed a method for manufacturing at least one first bipolar transistor, for example a high-speed transistor, and at least one second bipolar transistor, for example a high breakdown voltage transistor, within an integrated circuit.

This method comprises a joint manufacture of said at least one first transistor and of said at least one second transistor with the method as defined above, the implantation features in the substrate being different for said at least one first transistor and for said at least one second transistor.

According to another aspect, it is proposed an integrated circuit comprising a substrate and at least one bipolar transistor, for example a heterojunction bipolar transistor, including a collector region.

This collector region includes a first doped portion located in the substrate and a second doped portion covering and in contact with an area of the first doped portion.

The collector region has a doping profile having a peak in the first portion and a decrease from this peak up to in the second portion.

Moreover, the doping profile is advantageously devoid of plateau in the second portion.

According to one embodiment, the collector region may further comprise carbon.

According to one embodiment, the second portion may comprise, in the vicinity of the end thereof the furthest away from the first portion, a layer of semiconductor material containing carbon.

According to one embodiment, the integrated circuit comprises at least one first bipolar transistor and at least one second bipolar transistor, located in different places of the substrate, having identical topologies but different doping in the respective collector region thereof.

Transistors have identical topologies in particular when the respective structures of these transistors, in sectional view, (for example the geometry of the active regions thereof) have no significant difference apart from minor differences that may be due to a non-uniformity of manufacturing methods (for example a variability between the center and the edge of the wafer).

In other terms, the only ways to clearly distinguish between the two transistors are for example the analysis of the doping profile and the evaluation of the electric performance.

Thus, according to one embodiment, said at least one first transistor has a collector-emitter breakdown voltage-transition frequency pair different from the collector-emitter breakdown voltage-transition frequency pair of said at least one second transistor.

Said at least one first transistor may have, for example, a collector-emitter breakdown voltage of 1.5 Volts to the nearest 10% and a transition frequency of 400 GHz. Such a transistor may therefore be for example a high-speed transistor.

As to said at least one second transistor, it may have, for example, a collector-emitter breakdown voltage of 3 Volts to the nearest 10% and a transition frequency of 200 GHz. This second transistor may therefore be a high breakdown voltage transistor.

BRIEF DESCRIPTION OF THE DRAWINGS

Other advantages and features of the invention will become apparent upon examination of the detailed description of non-limiting implementations and embodiments, and of the appended drawings, wherein.

DETAILED DESCRIPTION

Figure 1:
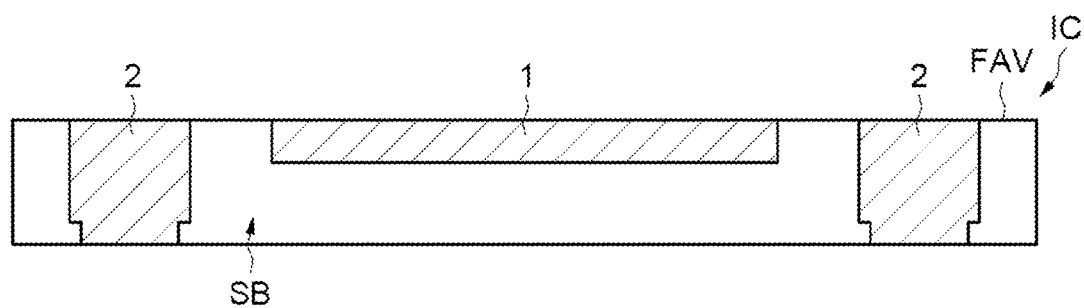
FIGS. 1-12 show steps of a method of manufacture.

In FIG. 1, the reference IC designates an integrated circuit including a semiconductor substrate SB, for example made of silicon. In this substrate, insulating regions 1 and 2 have been produced in a conventional and known per se manner in the substrate from the front face FAV thereof.

Figure 2:
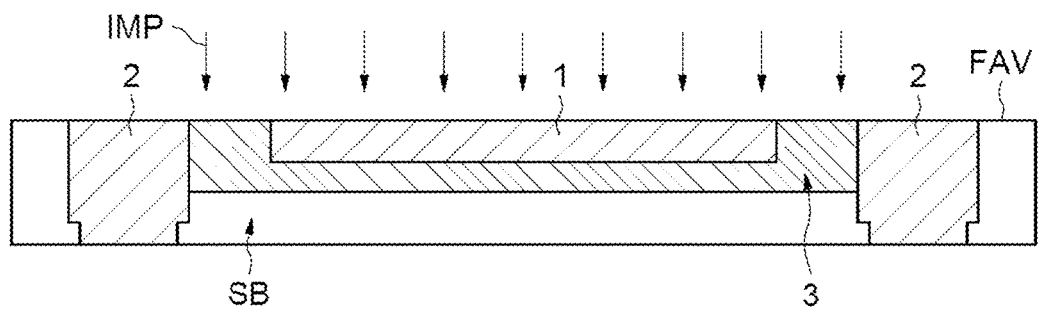

Then, as illustrated in FIG. 2, an implantation IMP of dopants, here phosphorus, is carried out, in the substrate SB so as to form a first doped portion 3 that will be a first portion of the future collector region of the transistor and that will be used as a dopant reservoir.

Here, it should be noted that the bipolar transistor that will be formed is a NPN transistor. However, embodiments herein also apply to the formation of a PNP bipolar transistor. In this case, phosphorus can be replaced with boron.

The dose of dopants implanted and the implantation energy depend on the final desired profile of the collector region of the transistor.

By way of indication, it is possible to implant a dose of phosphorus between $10^{14}$ atoms per cm$^2$ and $10^{15}$ atoms per cm$^2$, for example in the order of $5\times10^{14}$ atoms per cm$^2$.

The depth of the implantation peak depends here also on the desired profile. By way of indication, it is possible to choose an implantation energy so as to have a phosphorus peak located in the substrate at a distance between 60 and 70 nanometers from the front face FAV.

It will be seen in more detail hereafter that it is also possible to carry out at this stage, in addition to the phosphorus implantation, a carbon ion implantation.

Figure 3:
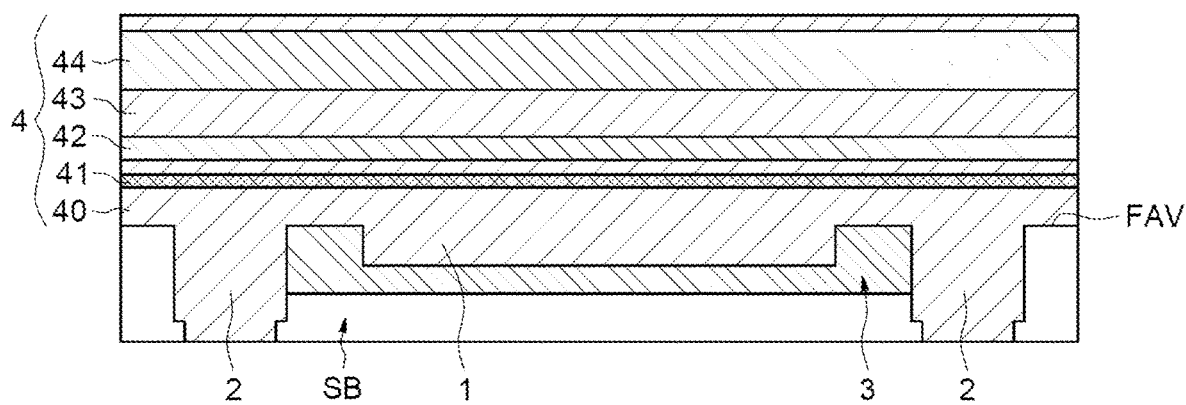

Then, as illustrated in FIG. 3, in a conventional and known per se manner, a stack 4 of layers is formed covering the first doped portion 3.

In this example, the stack 4 includes particularly a supplementary insulating layer 40 topped with a layer 41 of P-doped polysilicon, for forming a portion of the future extrinsic base of the transistor, a layer 42 of P-doped silicon for forming the future intrinsic base of the transistor, another insulating layer 43 (silicon nitride) topped with another insulating layer 44 (silicon dioxide). A layer of P-type silicon for forming after N-type implantation the emitter region of the bipolar transistor, is at this stage not yet present and will be deposited subsequently.

Figure 4:
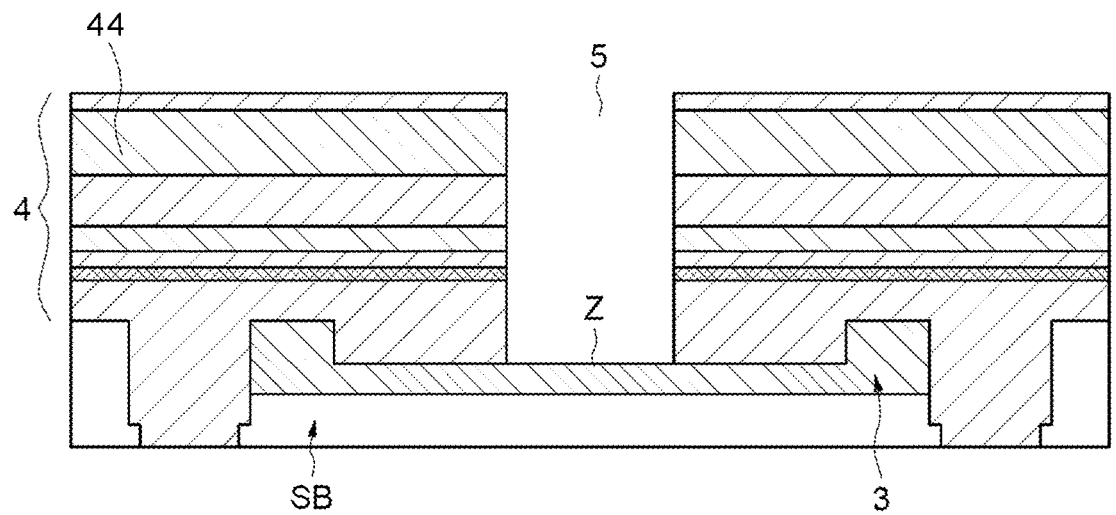

Then, as shown in FIG. 4, a cavity 5 is formed in a conventional and known per se manner in the stack 4, until uncovering the surface of said area of the first doped portion 3.

Figure 5:
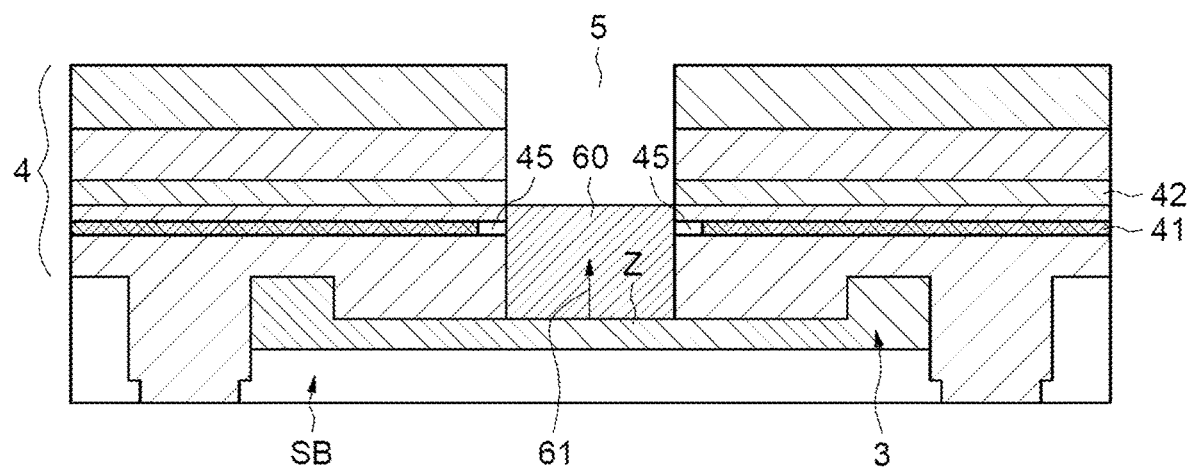

In the following step, illustrated in FIG. 5, it is carried out from the upper face of the area Z an epitaxy of non-doped single-crystal silicon 60 until reaching a height corresponding to the start of the future intrinsic base region of the transistor TR.

This epitaxiated region 60 therefore covers the area Z and is in physical contact with the first doped portion 3.

The conditions for performing such an epitaxy are known per se.

The epitaxy generally occurs at a relatively high temperature, for example 700° C., and it also activates a diffusion 61 of dopants present in the first doped portion 3 that here acts as a dopant reservoir.

In other terms, the epitaxy and the diffusion occur jointly and make it possible to obtain a second portion 60 of the collector region also doped.

It should be noted here that in a conventional and known manner, air pockets 45 occur during the epitaxy, at the ends of the layer 41, which will reinforce the insulation between the collector and the extrinsic base.

By way of indication, in this example of embodiment, the thickness (height) of the second portion 60 of the collector region may be in the order of 45 nanometers.

So as to be able to accurately adjust the desired doping profile in fine, it is particularly advantageous to be able to control the diffusion of the dopants in the epitaxiated semiconductor material 60.

Figure 6:
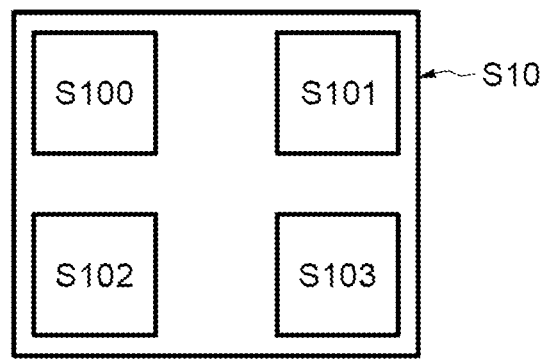

In this regard, as illustrated very schematically in FIG. 6, this control S10 may be carried out in various ways that may be considered alone or in combination with one another.

Thus, the control S10 may comprise an adjustment S100 of the dose of dopants (phosphorus for example), and/or of the depth of the peak of the quantity of dopants implanted in the first portion 3, and therefore in the area Z.

It is also possible that the control S10 of the diffusion comprises, as indicated above, a carbon ion implantation S101 in the substrate so as to include carbon in the first doped portion 3.

Indeed, carbon makes it possible to control the diffusion of phosphorus (or boron) in the epitaxiated non-doped semiconductor material.

By way of indication, it is possible to implant a carbon dose between $10^{14}$ atoms per $cm^2$ and $10^{15}$ atoms per $cm^2$, for example equal to $5\times10^{14}$ atoms/$cm^2$.

It is also possible to control the diffusion of dopants by carrying out an adjustment S102 of the carbon dose and/or of the depth of the quantity peak of carbon implanted in said area Z, relative to the dose of dopants (phosphorus for example) and/or of the depth of the quantity peak of dopants, phosphorus for example, implanted in said area Z.

Thus, with an implanted phosphorus dose of $10^{19}$ atoms per $cm^2$ and an implanted carbon dose of $10^{20}$ atoms per $cm^2$, it is possible to choose the implantation energy so as to have a phosphorus peak between 60 and 70 nanometers of the front face FAV of the substrate and a carbon peak between 50 and 60 nanometers.

Figure 7:
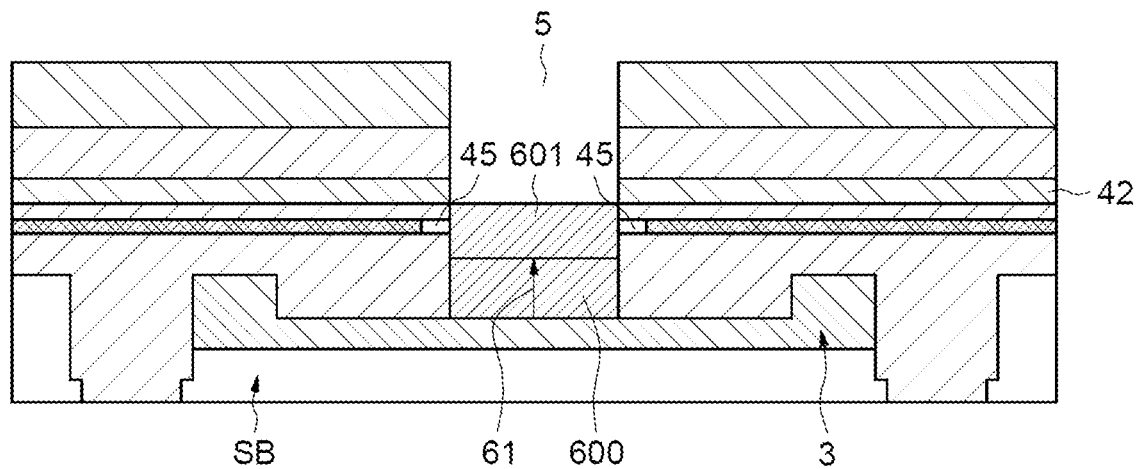

It is also possible, as illustrated in FIG. 6 and in FIG. 7, that the control of the diffusion of dopants comprises an in situ doping S103 of carbon in the non-doped epitaxiated material.

More specifically, as illustrated in FIG. 7, the epitaxy of the non-doped material (non-doped single-crystal silicon) stops at a distance from the layer 42 for forming the future intrinsic base region of the bipolar transistor. The epitaxy then continues with an in situ doping of carbon until reaching the layer 42 so as to form in the second portion of the collector region an upper layer 601 of silicon containing carbon and coming into contact with this layer 42 and therefore into contact with the future intrinsic base region of the transistor.

This epitaxy with an in situ doping is carried out conventionally, with the aid of silane and carbon and reinforces the presence of carbon at the top of the collector region.

By way of indication, the thickness of this layer 601 may be, in this embodiment, by way of indication in the order of 20 nanometers.

During the production of the stack 4, the thermal budgets used may already activate a certain diffusion of dopants and/or of carbon in the first doped portion 3.

Figure 8:
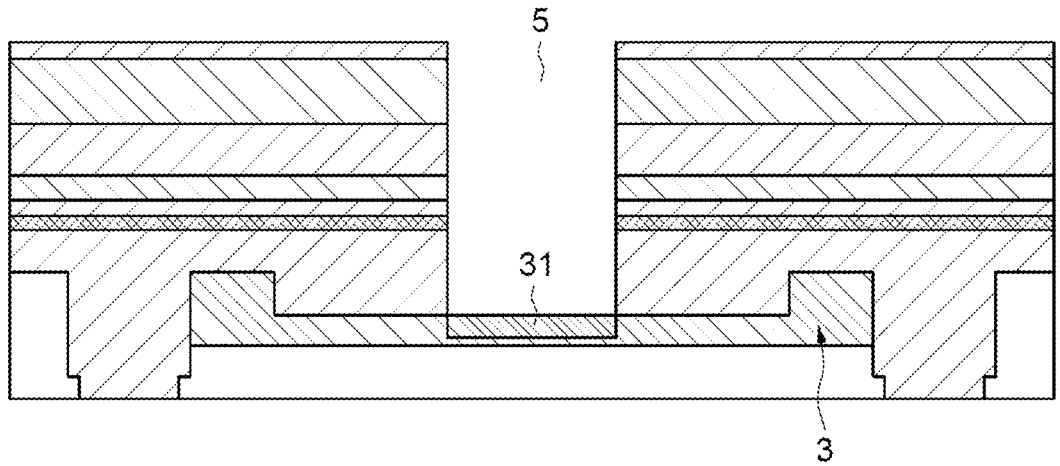

Thus, in this case, it is advantageously intended, as illustrated in FIG. 8, once the cavity 5 has been formed, to perform an additional implantation of phosphorus and/or of carbon in the first doped portion 3 through the cavity 5 so as to form an additional dopant reservoir 31.

By way of indication, it is again possible to implant a phosphorus dose of $10^{19}$ atoms per $cm^2$ and a carbon dose of $10^{20}$ atoms per $cm^2$ with an energy leading to a surface implantation.

Figure 9:
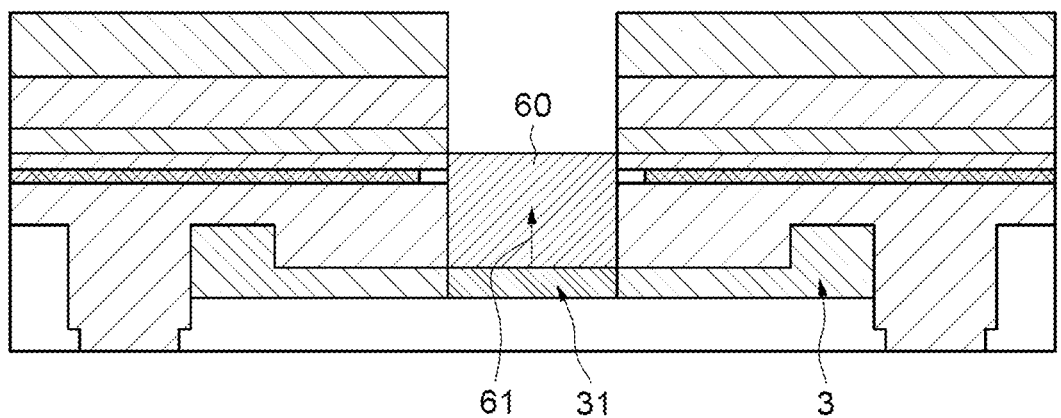

Then, as illustrated in FIG. 9, the diffusion 61 of dopants in the epitaxiated material 60 is carried out from the first doped portion 3 reinforced by the supplementary reservoir 31.

Figure 10:
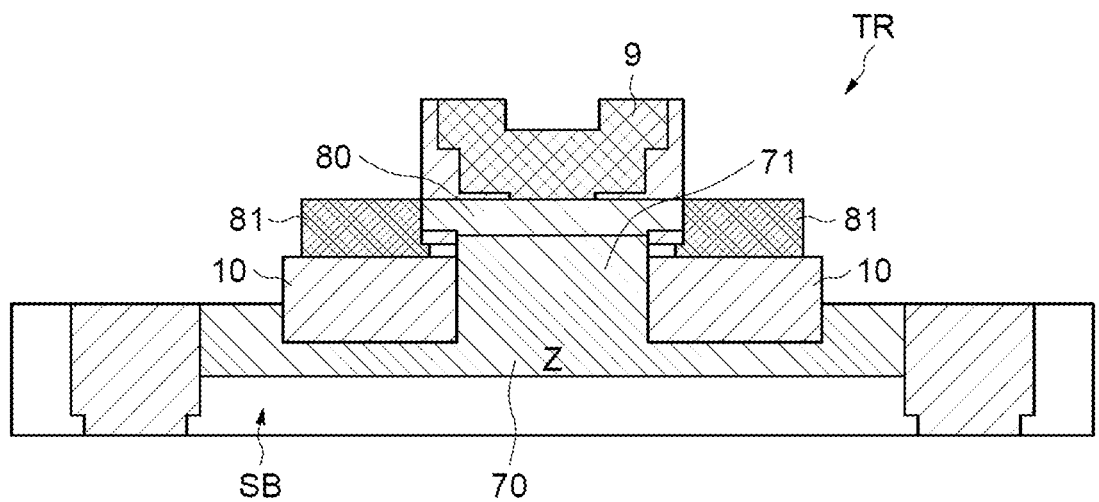

After conventional subsequent steps of manufacturing a bipolar transistor, as illustrated in FIG. 10, an example of bipolar transistor TR within the integrated circuit IC is obtained.

The bipolar transistor includes a collector region including a first doped portion 70 located in the substrate SB and a second doped portion 71 covering and in contact with an area Z of the first doped portion 70.

Moreover, the bipolar transistor includes an extrinsic base region 81, an intrinsic base region 80 and an emitter region 9.

The transistor TR is here an NPN bipolar transistor, having for example a heterojunction intrinsic base 80 (including, for example, silicon and germanium).

In the embodiment of FIG. 10, the isolating region 10 has the form of a unique Super Shallow Trench Isolation (SSTI).

Figure 11:
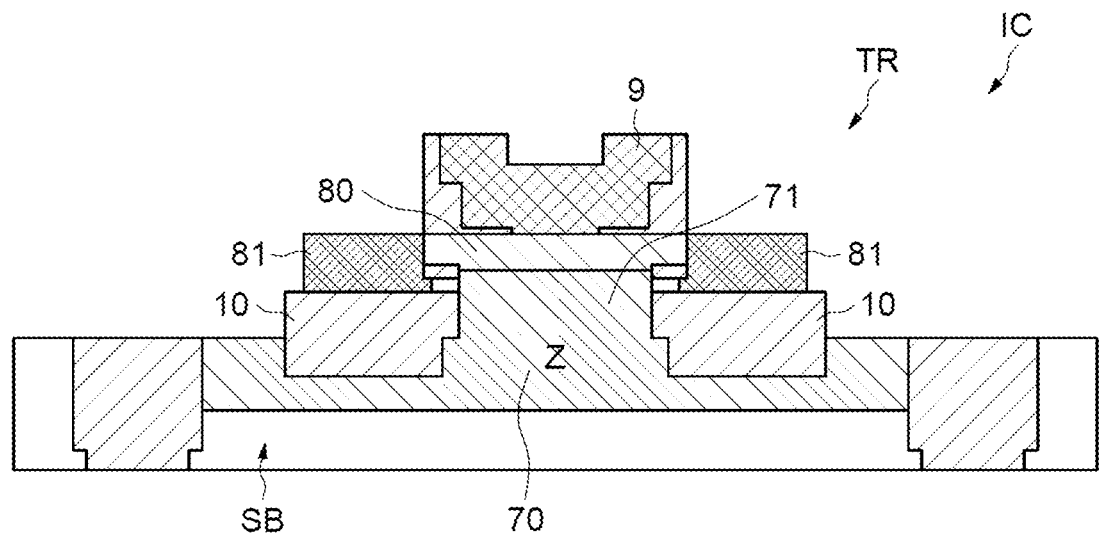
Figure 12:
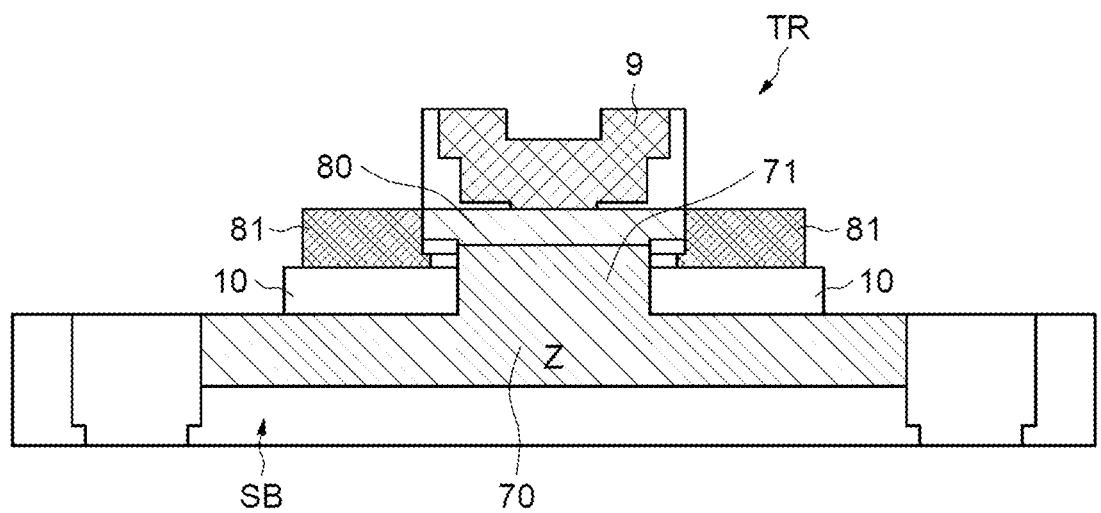

However, embodiments herein are not limited to this embodiment and is perfectly compatible with other embodiments of bipolar transistors TR such as same schematically illustrated in FIG. 11 and in FIG. 12.

More particularly, in FIG. 11, the isolating region 10 has the form of an isolating super trench in the shape of a ring surrounding the intrinsic collector region.

In this regard, it can be noted in FIG. 10 that the height of the second portion 71 of the collector region, for example in the order of 95 nanometers, is higher than the height, for example 45 nanometers, of the portion 71 of the collector region of the transistor in FIG. 11.

In FIG. 12, the isolating region 10 does not include super shallow trench isolation and only includes an isolating region located on the surface of the substrate SB.

Figure 13:
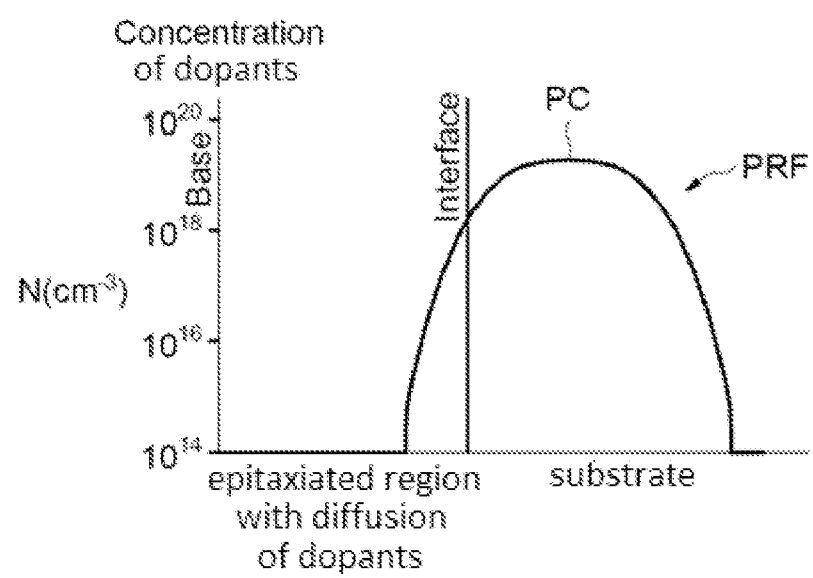
FIG. 13 is a graph showing a doping profile.

As schematically illustrated in FIG. 13, the collector region of a transistor TR according to one embodiment of the invention, has a doping profile PRF having a peak PC located in the first portion of the collector region, that is to say in the substrate, and a decrease from this peak PC up to in the second portion that is to say in the epitaxiated region with diffusion of dopants.

Moreover, it can be seen that the doping profile has substantially the shape of a Gaussian and is devoid of plateau in the second portion.

Figure 14:
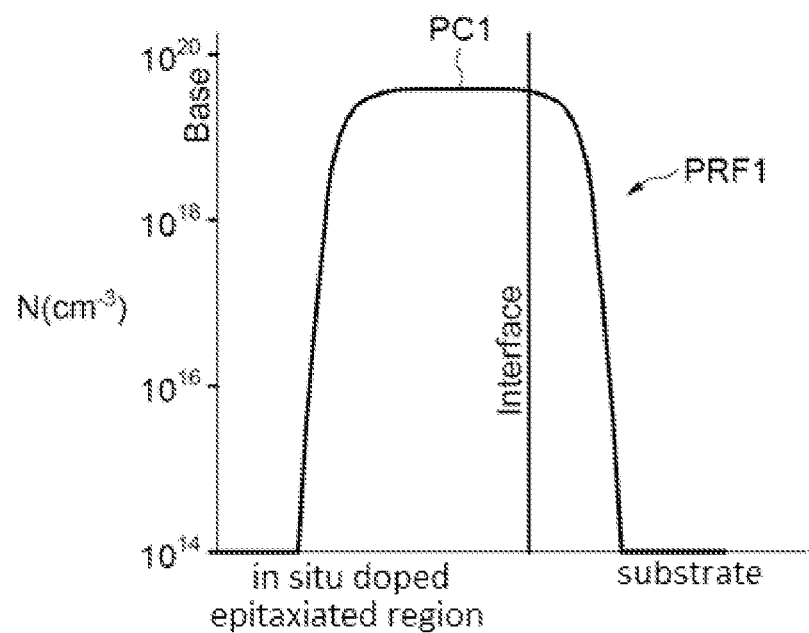
FIGS. 14-15 are graphs showing doping profiles in accordance with the prior art.

Such a doping profile is therefore clearly distinguished from a doping profile according to the prior art such as illustrated in FIG. 14 and that would be obtained by an in situ doped epitaxiated region of the collector.

In this case, the doping profile PRF1 of the prior art has a plateau and a peak PC1 located in the in situ doped epitaxiated region.

The profile PRF is also clearly distinguished from a profile PRF2 obtained by a transistor of the prior art whereof the collector region is an epitaxiated then implanted region.

Figure 15:
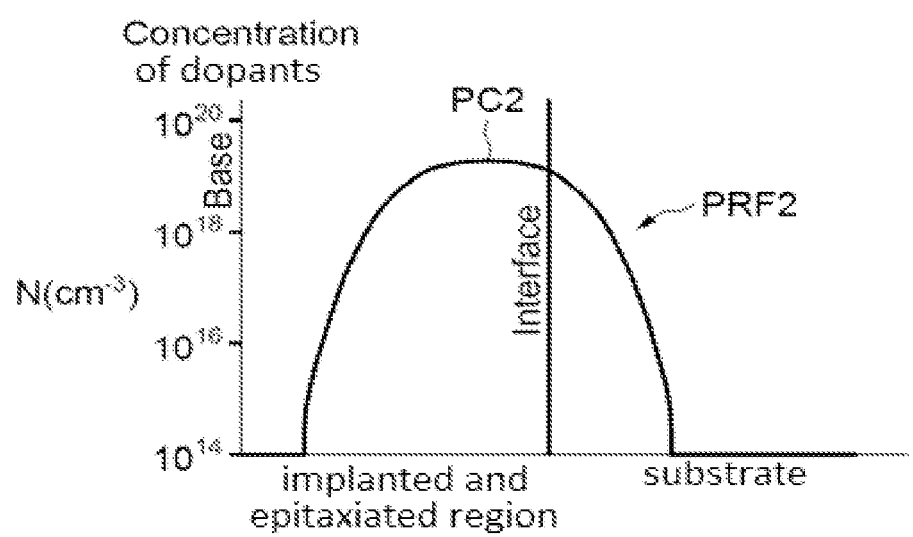

It can be seen is this FIG. 15 that the doping peak PC2 is this time located in the epitaxiated and implanted region.

Reference is now made more particularly to FIGS. 16 to 19 to describe an embodiment for a joint production of a first transistor TRA and of a second transistor TRB located in two different places of the integrated circuit IC.

Figure 16:
FIGS. 16-18 show steps of a method of manufacture.

More particularly, as illustrated in FIG. 16, after having produced, in a similar way as described with reference to FIG. 1, the isolating regions 1A and 2A within a first portion SBA and the isolating regions 1B and 2B of a second portion SBB of the substrate, the structure obtained on the left portion of FIG. 16 is covered with a mask MSKA and, in a similar way to that described with reference to FIG. 2, an implantation of dopants and optionally of carbon is carried out, so as to obtain a first doped portion 3B of the future collector region of the transistor TRB.

Figure 17:
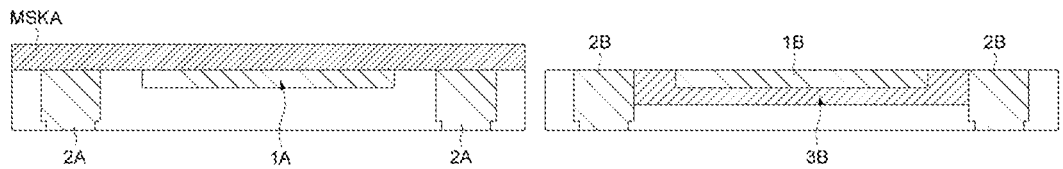
Figure 18:
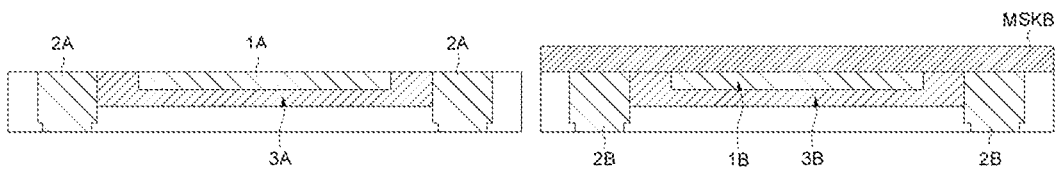

Then, as illustrated on the right-hand side of FIG. 18, the structure obtained on the right-hand side of FIG. 17 is covered with a mask MSKB and another implantation, in a similar way to that described with reference to FIG. 3, of dopants and optionally of carbon, is carried out on the surface of the structure of the left-hand side of FIG. 17, clear of the mask MSKA.

For the future transistor TRA, a first doped collector portion 3A is then obtained.

Figure 19:
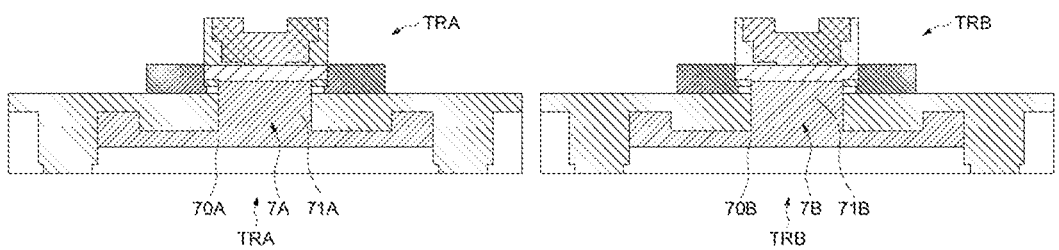
FIG. 19 illustrates a bipolar transistor.

Then, steps similar to those described in FIGS. 3 to 12 are carried out so as to obtain in fine the bipolar transistor TRA illustrated on the left-hand side of FIG. 19 and the bipolar transistor TRB illustrated on the right-hand side of FIG. 19.

The transistor TRA and the transistor TRB have identical topologies (geometry of collector regions, etc.) but different doping in the collector. This makes it possible, for example, of jointly producing on the same substrate and by using a single epitaxy, a high-speed transistor, (for example the transistor TRA) and a high collector-emitter breakdown voltage transistor (for example the transistor TRB).

Figure 20:
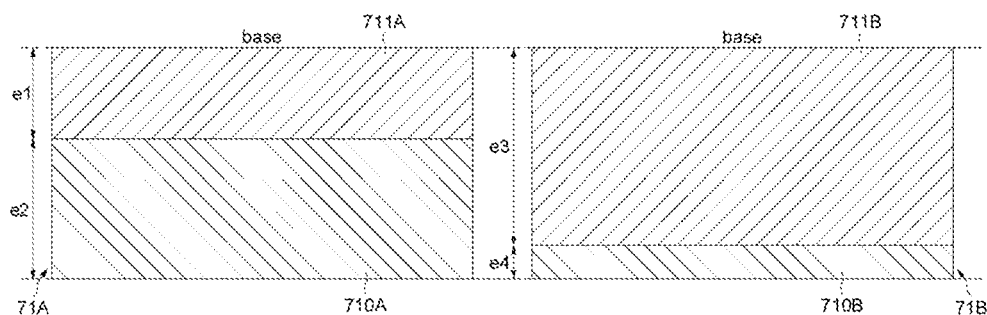
FIG. 20 illustrates a collector region.

In this regard, as illustrated in FIG. 20, it may be chosen for the transistor TRA a second portion 71A of the collector region having a first highly doped domain 710A, for example between $10^{18}$ and $10^{20}$ atoms per cm$^3$, topped by a lower doped domain 711A, for example having a concentration of dopants less than or equal to $10^{17}$ atoms per cm$^3$.

Moreover, the thickness e1 of the domain 711A is less than 50% of the total thickness e1+e2 of the epitaxy, for example in the order of 30% of this total thickness.

As regards the transistor TRB, the second portion 71B of the collector region thereof includes a first highly doped domain 710B, for example there again a concentration of dopants between $10^{18}$ and $10^{20}$ atoms per cm$^3$, topped by a less highly doped domain 711B, for example with a concentration of dopants less than or equal to $10^{17}$ atoms per cm$^3$.

However, this time, the thickness e4 of the domain 710B is less than 50% of the total thickness e3+e4 of the epitaxy, for example in the order of 10% of this total thickness.

The invention claimed is:

1. A method for manufacturing at least one bipolar transistor within an integrated circuit, comprising:
   producing a collector region by implanting dopants within a semiconductor substrate so as to form a first doped portion of the collector region and forming a second doped portion of the collector region covering and in contact with an area of the first doped portion;
   wherein forming the second doped portion comprises:
      epitaxial growing a non-doped semiconductor material from the surface of said area; and
      diffusing dopants in the epitaxiated material from the first doped portion;
   wherein said diffusing is activated at least by said epitaxial growing; and
   controlling said diffusing of dopants;
   wherein the second doped portion of the collector region is in contact with a base region of the transistor;
   wherein epitaxial growing of the non-doped material comprises stopping epitaxial growing at a distance from the base region; and
   wherein controlling comprises continuing epitaxial growing with an in situ doping of carbon in the non-doped material so as to form an upper layer of the semiconductor material in said second doped portion containing carbon in contact with the base region.

2. The method according to claim 1, further comprising controlling said diffusing of dopants by adjusting a dose of dopants implanted in said area.

3. The method according to claim 2, wherein controlling further comprises implanting carbon ions in the substrate so as to include carbon in said first doped portion.

4. The method according to claim 1, further comprising:
   forming a stack of layers covering said first doped portion;
   forming a cavity in said stack to uncover a surface of said area of the first doped portion; and
   forming said second doped portion in said cavity.

5. The method according to claim 4, further comprising, prior to forming said second doped portion, performing an additional implantation of dopants in the first doped portion through said cavity.

6. The method according to claim 5, further comprising implanting additional carbon ion in the first doped portion through said cavity.

7. The method according to claim 1, wherein said at least one bipolar transistor comprises at least one first bipolar transistor and at least one second bipolar transistor, the method further comprising:
   jointly manufacturing said at least one first transistor and said at least one second transistor;

wherein implanting comprises implanting different features in the substrate for said at least one first transistor and for said at least one second transistor.

8. A method for manufacturing at least one bipolar transistor within an integrated circuit, comprising:
    producing a collector region by implanting dopants within a semiconductor substrate so as to form a first doped portion of the collector region and forming a second doped portion of the collector region covering and in contact with an area of the first doped portion;
    wherein forming the second doped portion comprises:
        epitaxial growing a non-doped semiconductor material from the surface of said area; and
        diffusing dopants in the epitaxiated material from the first doped portion;
    wherein said diffusing is activated at least by said epitaxial growing; and
    controlling said diffusing of dopants by:
        adjusting a dose of dopants implanted in said area;
        implanting carbon ions in the substrate so as to include carbon in said first doped portion; and
        adjusting a carbon dose implanted in said area relative to adjusting the dose of dopants implanted in said area.

9. The method according to claim 8, wherein the second collector portion is in contact with a base region of the transistor, and wherein epitaxial growing of non-doped material comprises continuing epitaxial growing up to a level of said base region.

10. The method according to claim 8, wherein the second doped portion of the collector region is in contact with a base region of the transistor, wherein epitaxial growing of the non-doped material comprises stopping epitaxial growing at a distance from the base region, and wherein controlling comprises continuing epitaxial growing with an in situ doping of carbon in the non-doped material so as to form an upper layer of the semiconductor material in said second doped portion containing carbon in contact with the base region.

11. The method according to claim 8, further comprising:
    forming a stack of layers covering said first doped portion;
    forming a cavity in said stack to uncover a surface of said area of the first doped portion; and
    forming said second doped portion in said cavity.

12. The method according to claim 11, further comprising, prior to forming said second doped portion, performing an additional implantation of dopants in the first doped portion through said cavity.

13. The method according to claim 12, further comprising implanting additional carbon ion in the first doped portion through said cavity.

14. The method according to claim 8, wherein said at least one bipolar transistor comprises at least one first bipolar transistor and at least one second bipolar transistor, the method further comprising:
    jointly manufacturing said at least one first transistor and said at least one second transistor;
    wherein implanting comprises implanting different features in the substrate for said at least one first transistor and for said at least one second transistor.

15. A method for manufacturing at least one bipolar transistor within an integrated circuit, comprising:
    producing a collector region by implanting dopants within a semiconductor substrate so as to form a first doped portion of the collector region and forming a second doped portion of the collector region covering and in contact with an area of the first doped portion;
    wherein forming the second doped portion comprises:
        epitaxial growing a non-doped semiconductor material from the surface of said area; and
        diffusing dopants in the epitaxiated material from the first doped portion;
    wherein said diffusing is activated at least by said epitaxial growing; and
    controlling said diffusing of dopants by:
        adjusting a dose of dopants implanted in said area;
        implanting carbon ions in the substrate so as to include carbon in said first doped portion; and
        adjusting a depth of a quantity peak of carbon implanted in said area relative to adjusting the dose of dopants implanted in said area.

16. The method according to claim 15, wherein the second collector portion is in contact with a base region of the transistor, and wherein epitaxial growing of non-doped material comprises continuing epitaxial growing up to a level of said base region.

17. The method according to claim 15, wherein the second doped portion of the collector region is in contact with a base region of the transistor, wherein epitaxial growing of the non-doped material comprises stopping epitaxial growing at a distance from the base region, and wherein controlling comprises continuing epitaxial growing with an in situ doping of carbon in the non-doped material so as to form an upper layer of the semiconductor material in said second doped portion containing carbon in contact with the base region.

18. The method according to claim 15, further comprising:
    forming a stack of layers covering said first doped portion;
    forming a cavity in said stack to uncover a surface of said area of the first doped portion; and
    forming said second doped portion in said cavity.

19. The method according to claim 18, further comprising, prior to forming said second doped portion, performing an additional implantation of dopants in the first doped portion through said cavity.

20. The method according to claim 19, further comprising implanting additional carbon ion in the first doped portion through said cavity.

21. The method according to claim 15, wherein said at least one bipolar transistor comprises at least one first bipolar transistor and at least one second bipolar transistor, the method further comprising:
    jointly manufacturing said at least one first transistor and said at least one second transistor;
    wherein implanting comprises implanting different features in the substrate for said at least one first transistor and for said at least one second transistor.

22. A method for manufacturing at least one bipolar transistor within an integrated circuit, comprising:
    producing a collector region by implanting dopants within a semiconductor substrate so as to form a first doped portion of the collector region and forming a second doped portion of the collector region covering and in contact with an area of the first doped portion;
    wherein forming the second doped portion comprises:
        epitaxial growing a non-doped semiconductor material from the surface of said area; and
        diffusing dopants in the epitaxiated material from the first doped portion;

wherein said diffusing is activated at least by said epitaxial growing; and
controlling said diffusing of dopants by adjusting a depth of a quantity peak of dopants implanted in said area.

23. The method according to claim 22, wherein controlling further comprises implanting carbon ions in the substrate so as to include carbon in said first doped portion.

24. The method according to claim 23, wherein controlling further comprises adjusting a carbon dose implanted in said area relative to adjusting the depth of the quantity peak of dopants implanted in said area.

25. The method according to claim 23, wherein controlling further comprises adjusting a depth of a quantity peak of carbon implanted in said area relative to adjusting the depth of the quantity peak of dopants implanted in said area.

26. The method according to claim 22, wherein the second collector portion is in contact with a base region of the transistor, and wherein epitaxial growing of non-doped material comprises continuing epitaxial growing up to a level of said base region.

27. The method according to claim 22, wherein the second doped portion of the collector region is in contact with a base region of the transistor, wherein epitaxial growing of the non-doped material comprises stopping epitaxial growing at a distance from the base region, and wherein controlling comprises continuing epitaxial growing with an in situ doping of carbon in the non-doped material so as to form an upper layer of the semiconductor material in said second doped portion containing carbon in contact with the base region.

28. The method according to claim 22, further comprising:
forming a stack of layers covering said first doped portion;
forming a cavity in said stack to uncover a surface of said area of the first doped portion; and
forming said second doped portion in said cavity.

29. The method according to claim 28, further comprising, prior to forming said second doped portion, performing an additional implantation of dopants in the first doped portion through said cavity.

30. The method according to claim 29, further comprising implanting additional carbon ion in the first doped portion through said cavity.

31. The method according to claim 22, wherein said at least one bipolar transistor comprises at least one first bipolar transistor and at least one second bipolar transistor, the method further comprising:
jointly manufacturing said at least one first transistor and said at least one second transistor;
wherein implanting comprises implanting different features in the substrate for said at least one first transistor and for said at least one second transistor.

32. An integrated circuit, comprising:
a substrate; and
at least one bipolar transistor including:
a collector region including a first doped portion located in the substrate and a second doped portion covering and in contact with an area of the first doped portion;
wherein the collector region has a doping profile with a peak in concentration in the first doped portion and a decrease in concentration from this peak up to in the second doped portion; and
wherein the doping profile is devoid of a plateau in the second doped portion.

33. The integrated circuit according to claim 32, wherein the collector region further comprises carbon.

34. An integrated circuit, comprising:
a substrate; and
at least one bipolar transistor including:
a collector region including a first doped portion located in the substrate and a second doped portion covering and in contact with an area of the first doped portion;
wherein the collector region has a doping profile with a peak in concentration in the first doped portion and a decrease in concentration from this peak up to in the second doped portion; and
wherein the second doped portion comprises, in the vicinity of an end of the second doped portion furthest away from the first doped portion, a layer of semiconductor material containing carbon.

35. The integrated circuit according to claim 34, wherein the doping profile is devoid of a plateau in the second portion.

36. An integrated circuit, comprising:
a substrate; and
at least one bipolar transistor including:
a collector region including a first doped portion located in the substrate and a second doped portion covering and in contact with an area of the first doped portion;
wherein the collector region has a doping profile with a peak in concentration in the first doped portion and a decrease in concentration from this peak up to in the second doped portion; and
wherein the collector region further comprises carbon;
wherein a concentration peak of the carbon is at a first depth from a front face of the substrate, and wherein a concentration peak of the dopant is at a second depth from the front face of the substrate, wherein the second depth is deeper than the first depth.

37. The integrated circuit according to claim 36, wherein the doping profile is devoid of a plateau in the second portion.

38. An integrated circuit, comprising:
a substrate; and
at least one bipolar transistor including:
a collector region including a first doped portion located in the substrate and a second doped portion covering and in contact with an area of the first doped portion;
wherein the collector region has a doping profile with a peak in concentration in the first doped portion and a decrease in concentration from this peak up to in the second doped portion;
wherein said at least one bipolar transistor comprises a first bipolar transistor and a second bipolar transistor, wherein the first and second bipolar transistors are located in different places of the substrate, and wherein the first and second bipolar transistors have identical topologies but different dopings in the respective collector region thereof; and
wherein said first transistor has a collector-emitter breakdown voltage-transition frequency pair different from a collector-emitter breakdown voltage-transition frequency pair of said second transistor.

39. The integrated circuit according to claim 38, wherein the doping profile is devoid of a plateau in the second portion.

40. The integrated circuit according to claim 38, wherein the collector region further comprises carbon.

* * * * *